United States Patent
Pao et al.

(10) Patent No.: US 7,379,509 B2
(45) Date of Patent: May 27, 2008

(54) DIGITAL INTERMEDIATE FREQUENCY QAM MODULATOR USING PARALLEL PROCESSING

(75) Inventors: Hsueh-Yuan Pao, Livermore, CA (US); Binh-Nien Tran, San Ramon, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 379 days.

(21) Appl. No.: 10/644,561

(22) Filed: Aug. 19, 2003

(65) Prior Publication Data

US 2004/0136471 A1    Jul. 15, 2004

Related U.S. Application Data

(60) Provisional application No. 60/404,596, filed on Aug. 19, 2002.

(51) Int. Cl.
*H04L 27/36* (2006.01)

(52) U.S. Cl. .................. 375/298; 375/261; 332/103

(58) Field of Classification Search .............. 375/298, 375/261, 277, 259, 260, 271, 272, 295, 300, 375/301; 332/103, 104, 105
See application file for complete search history.

(56) References Cited

U.S. PATENT DOCUMENTS

| | | | | |
|---|---|---|---|---|
| 4,534,040 A | * | 8/1985 | Thapar | 375/261 |
| 5,123,031 A | * | 6/1992 | Kuisma | 375/296 |
| 5,453,720 A | * | 9/1995 | McCullough et al. | 332/103 |
| 5,612,651 A | * | 3/1997 | Chethik | 332/103 |
| 5,745,527 A | * | 4/1998 | Kelton et al. | 375/308 |
| 5,815,531 A | * | 9/1998 | Dent | 375/298 |
| 5,838,727 A | * | 11/1998 | Lyon et al. | 375/261 |
| 5,838,728 A | * | 11/1998 | Alamouti et al. | 375/265 |
| 5,907,264 A | * | 5/1999 | Feldman | 332/103 |
| 6,141,387 A | * | 10/2000 | Zhang | 375/261 |
| 6,175,599 B1 | * | 1/2001 | Lyon et al. | 375/261 |
| 6,430,228 B1 | * | 8/2002 | Zhang | 375/261 |
| 6,628,727 B1 | * | 9/2003 | Wu et al. | 375/281 |
| 6,674,811 B1 | * | 1/2004 | Desrosiers et al. | 375/298 |
| 6,763,072 B1 | * | 7/2004 | Matsui et al. | 375/260 |
| 2003/0081693 A1 | * | 5/2003 | Raghavan et al. | 375/298 |

(Continued)

FOREIGN PATENT DOCUMENTS

WO    WO 00/65799 A1    11/2000

OTHER PUBLICATIONS

Klymyshyn D. M. et al, "FPGA Implementation of Multiplierless M-QAM Modulator", Electronics Letters, vol. 38, No. 10, May 9, 2002, pp. 461-462.

*Primary Examiner*—Chieh M. Fan
*Assistant Examiner*—Naheed Ejaz
(74) *Attorney, Agent, or Firm*—John P. Wooldridge; James S. Tak; John H. Lee

(57) ABSTRACT

The digital Intermediate Frequency (IF) modulator applies to various modulation types and offers a simple and low cost method to implement a high-speed digital IF modulator using field programmable gate arrays (FPGAs). The architecture eliminates multipliers and sequential processing by storing the pre-computed modulated cosine and sine carriers in ROM look-up-tables (LUTs). The high-speed input data stream is parallel processed using the corresponding LUTs, which reduces the main processing speed, allowing the use of low cost FPGAs.

12 Claims, 8 Drawing Sheets

U.S. PATENT DOCUMENTS

2003/0156659 A1* 8/2003 Hanaoka et al. ............ 375/298
2003/0179830 A1* 9/2003 Eidson et al. ............... 375/296
2004/0091060 A1* 5/2004 Becker ....................... 375/298

* cited by examiner

Prior Art

Prior Art

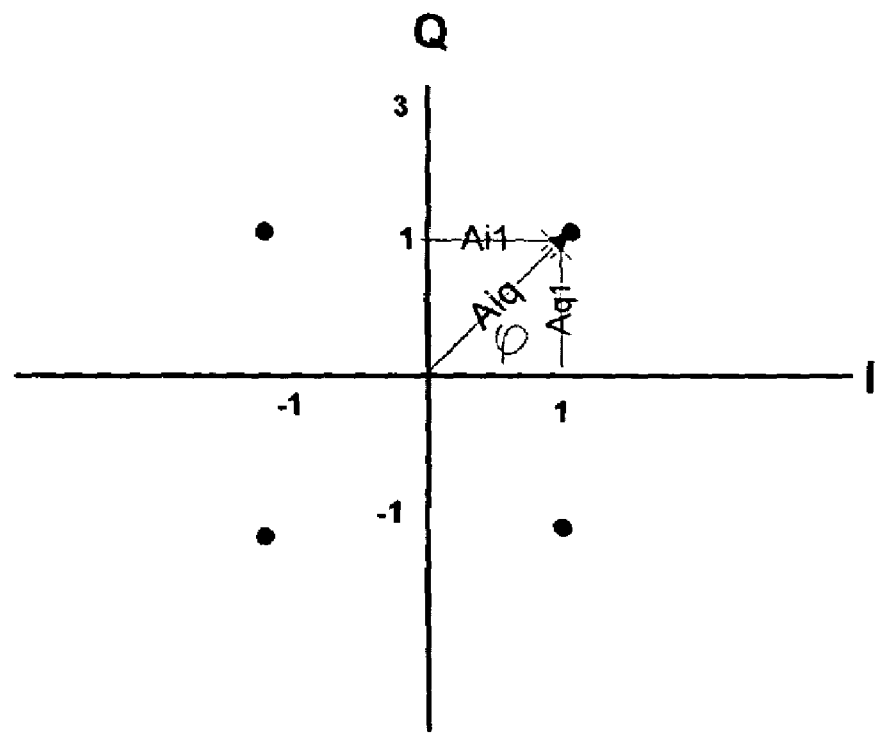
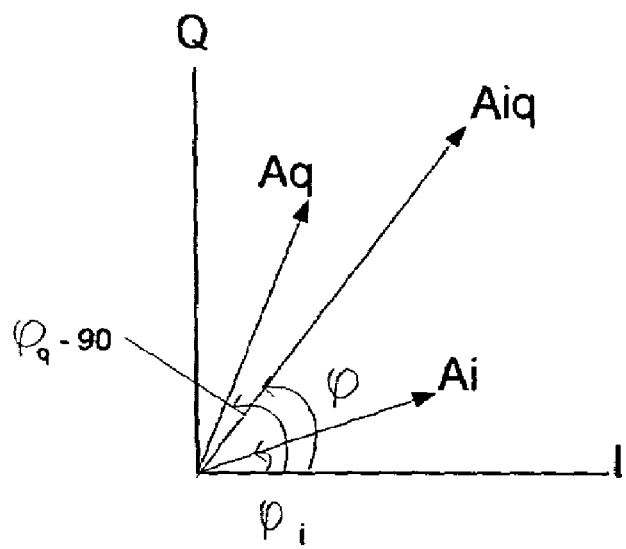
Figure 4A (lower) and Figure 4B (upper)

DIGITAL INTERMEDIATE FREQUENCY QAM MODULATOR USING PARALLEL PROCESSING

This applications claims priority to U.S. Provisional Patent Application Ser. No. 60/404,596, titled "Digital IF Modulator Using Parallel Processing" filed Aug. 19, 2002, incorporated herein by reference.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to digital quadrature amplitude modulation, and more specifically, it relates to a digital intermediate frequency (IF) modulator which can be implemented with low cost field programmable gate arrays (FPGAs) to generate very high IF carrier frequencies.

2. Description of Related Art

FIG. 1A depicts a prior art digital Quadrature Amplitude Modulation (QAM) Intermediate Frequency (IF) modulator using a Numerical Control Oscillator (NCO) 1010 and multipliers 1000 and 1030. QAM employs modulation where phase and amplitude are changed according to data input signals. The method is bandwidth efficient but requires high amplitude and phase accuracy. The data input signal is a complex signal that consists of real and imaginary parts. In digital communication, I (In-phase) and Q (Quadrature phase) are used to represent real and imaginary parts. There are M possible symbols, and thus, the technique is normally written as M-QAM. A symbol represents one point in the I/Q constellation. Symbol rate is bit rate divided by $\log_2 M$.

The 1070 module converts input data from bit rate to symbol rate that is determined by the type of digital M-QAM modulator selected. The serial data are digital in strict sense, and are coming from any digital device at 1 bit per clock cycle. The grouping of the serial bits into k-bits follows the equality k=log2M, where M is the M-QAM modulation scheme. Each group of k-bits are then fed in parallel to the 1060, where the k-bits are mapped into I-bits and Q-bits parallel data. The numbers of I-bits and Q-bits are mapped according to the selected M-QAM constellation. For a square constellation, the numbers of I-bits and Q-bits=k-bits/2. The value of the I-bits and Q-bits represented is determined by the type of mapping used. For instance, GRAY coding requires that I and Q have values that are different by no more than one logical position. 1080 and 1100 performs the pulse shaping on the I-bits and Q-bits of data to remove the intersymbol interference (ISI), as well as reducing the radio bandwidth. The 1090 and 1200 adds more zero data samples to the output of the 1080 and 1100 to match the speed of the 1012 and 1013 prior to digitally multiplying the digital samples at 1000 and 1030. And the results are added digitally at a 1020 to produce the digital modulated carrier. The operation is done at DAC's speed, which is lots higher than the symbol rate, typically, the DAC's speed is more than 10 times that of the symbol rate. The 1020 digital data samples are converted to analog waveform via DAC. This is the Intermediate Frequency (IF) since it is sent further down the chain to the RFE (Radio Front End) for amplification, filtering, and final carrier upconversion prior to transmission.

FIG. 1B is a prior art block diagram illustrating how the sine IF frequency is generated by the NCO. The sine carrier frequency, of Phase accumulator 1011 is generated by successively adding the phase M-word loaded into the parallel phase register until the phase accumulator is overflowed, which is then addressed to the sine ROM 1013. The digital sine and cosine output is then sequentially multiplied to the digitally filtered I and Q after band-limiting and interpolation to the matched fc, which is the sampling frequency of the Digital to Analog converter (D/A).

Referring again to FIG. 1A, the digital output of the NCO at 1020 is $S(n)=Ai(n)Cos(\omega_{if}t(n))+Aq(n)Sin(\omega_{if}t(n))$, where $\omega_{if}$ is the output frequency of the NCO and Ai(n) and Aq(n) are the quadrature data symbols.

A drawback from the use of an NCO is that the Digital IF QAM Modulator requires two multipliers 1000 and 1030, which results in inefficient field programmable gate array (FPGA) implementation. FPGA is a generic terminology for programmable logic device, all digital design are realizable using FPGA, or ASIC.

Additionally, 1012 and 1013 require large ROMs in order to achieve acceptable spectral purity. The size of ROM is $(2^k \times M)$, where k is the truncated phase address, which is normally 14 bits or above, and M is the bus width of the ROM (typically determined by the DAC resolution, e.g., 8-bit to 12-bits, without compression). Furthermore, the sequential operation of the NCO, multiplier, and adder logic demands that the digital operation speed be the same as that of fc (sampling frequency). As a result for higher fo frequency, an increase in power and cost will result fo is an output frequency generated after the digital data are fed through the DAC (digital to Analog Converter). The Nyquist requirement dictates that the fc greater or equal to 2fo frequency.

FIG. 2 depicts a Coordinate Rotation Digital Computer (CORDIC)-based digital QAM modulator. CORDIC 1100 implements the same functions as the cosine and sine ROMs of FIG. 1A, using arrays of adders and subtractors. The goal is to remove the multipliers and sine/cosine ROMs, which cannot be realized efficiently using FPGAs or Application Specific Integrated Circuits (ASICs). According to WO 00/65799, the CORDIC circular rotator performs small successive rotations to achieve the phase to amplitude conversion without the use of Sine and Cosine ROMs.

A drawback of the CORDIC-based digital QAM IF is that its modulator phase accumulator operates at the same speeds as the D/A, and thus demands more power, which translates directly to high cost and more spectrum noise. For upsampling, the D/A sampling speed is at least 3 times the phase accumulator speed. For an 80 MHz IF modulator carrier, this requires a FPGA normal operating speed of 240 MHz for the CORDIC and phase accumulator logic. It is realizable but expensive for this kind of FPGA speed.

Wireless and wire communication systems using digital QAM IF modulation have been limited to ASIC due to the lack of a simple algorithm to implement a high speed, low cost and low power digital QAM IF modulator. It is therefore desirable to provide a digital QAM IF modulator that can be implemented very efficiently using the basic logic structure of a FPGA, such as adders, multiplexers and ROM Look-up-tables (LUTs). The present invention provides such a device

SUMMARY OF THE INVENTION

It is an object of the present invention to provide embodiments of a digital IF modulator that can be implemented with low cost FPGAs.

It is another object of the invention is to simplify the implementation of a digital IF modulator.

Another object of the invention is to enable programmability of the digital IF modulator's carrier frequency and modulation types.

These and other objects will be apparent based on the disclosure herein.

The present invention is a digital IF modulator that can be implemented with a low cost FPGA. Only adders and LUTs are used to process highly complicated input data streams by the present simplified digital IF modulator. Only a single cycle of the IF modulated waveform is stored in the LUT, further reducing the size of the LUT. Thus, a low speed FPGA can be used to generate a high carrier frequency output Another aspect of this invention is the programmability of the digital IF modulator's carrier frequency and modulation types. Existing commercial wireless or wire systems such as Global System for Mobile Communications (GSM), Code Division Multiple Access (CDMA) and xDSL that use digital IF modulation of any types can benefit from this invention.

GSM, short for Global System for Mobile Communications, is one of the leading digital cellular systems. GSM uses narrowband TDMA, which allows eight simultaneous calls on the same radio frequency. GSM was first introduced in 1991. As of the end of 1997, GSM service was available in more than 100 countries and has become the de facto standard in Europe and Asia.

TDMA is short for Time Division Multiple Access, a technology for delivering digital wireless service using time-division multiplexing (TDM). TDMA works by dividing a radio frequency into time slots and then allocating slots to multiple calls. In this way, a single frequency can support multiple, simultaneous data channels. TDMA is used by the GSM digital cellular system Code Division Multiple Access CDMA is cellular technology that competes with GSM technology for dominance in the cellular world. XDSL refers collectively to all types of digital subscriber lines, the two main categories being ADSL and SDSL. Two other types of xDSL technologies are High-data-rate DSL (HDSL) and Very high DSL (VDSL).

DSL technologies use sophisticated modulation schemes to pack data onto copper wires. They are sometimes referred to as last-mile technologies because they are used only for connections from a telephone switching station to a home or office, not between switching stations.

xDSL is similar to ISDN inasmuch as both operate over existing copper telephone lines (POTS) and both require the short runs to a central telephone office (usually less than 20,000 feet). However, xDSL offers much higher speeds—up to 32 Mbps for upstream traffic, and from 32 Kbps to over 1 Mbps for downstream traffic. Mbps, short for megabits per second, a measure of data transfer speed (a megabit is equal to one million bits). Network transmissions, for example, are generally measured in Mbps. When spelled MBps, it is short for megabytes per second. The term "bit" is short for binary digit, the smallest unit of information on a machine. The term was first used in 1946 by John Tukey, a leading statistician and adviser to five presidents. A single bit can hold only one of two values: 0 or 1. More meaningful information is obtained by combining consecutive bits into larger units. For example, a byte is composed of 8 consecutive bits.

It is desirable to implement FPGAs into the present Digital IF Modulator for a number of reasons. A FPGA is a low power complementary metal oxide semiconductor (CMOS) integrated circuit that is characterized as a high performance, high speed device. It is flexible in implementation; it is programmable, re-programmable and field upgradeable. The use of these devices enables a short time-to-market because FPGAs are off-the-shelf devices in inventory. They have functional extensions and are a standard part.

BRIEF DESCRIPTION OF THE DRAWINGS

FIG. 4A depicts the two vectors Aq and Ai with angular rotation and phase.

FIG. 4B represents a 4-QAM constellation.

DETAILED DESCRIPTION OF THE INVENTION

Quadrature Amplitude Modulation (QAM) provides modulation where the phase and amplitude of an input signal are changed according to message signals. These modulators are bandwidth efficient but require higher amplitude and phase accuracy. A complex input signal consists of real and imaginary parts. In digital communication, I (In-phase) and Q (Quadrature phase) are used to represent the real and imaginary parts of a complex input signal. The term is normally written as M-QAM, where M refers to the number of possible symbols. A symbol represents one point in the I/Q constellation, symbol rate is bit rate divided by $\log_2 M$ In a complex plane, the real part (I value) and the imaginary (Q value) of a complex number can uniquely determine its position in the plane. No phase information is needed. If the amplitude or phase noise is too high, there will not be a clean constellation, which makes it hard to detect the signal. By changing the incoming serial data streaming to a low speed symbol, for example 64-QAM, M=64, the symbol rate is reduced $\log_2(64)=6$ times.

Figure 1A:
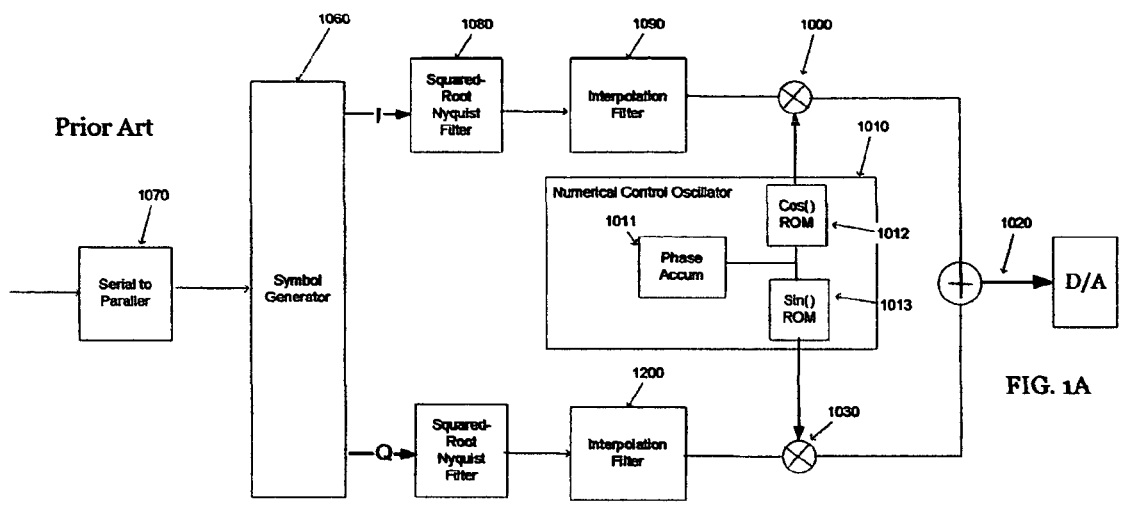
FIG. 1A depicts a prior art digital Quadrature Amplitude Modulation (QAM) Intermediate Frequency (IF) modulator using a Numerical Control Oscillator and multipliers.
Figure 1B:
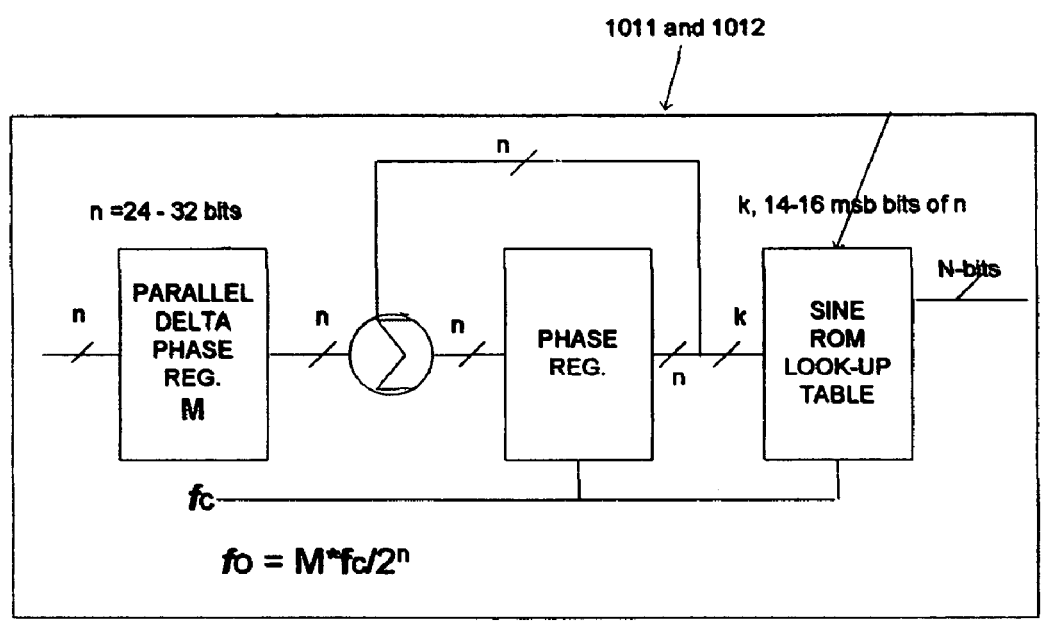
FIG. 1B is a prior art block diagram illustrating how the sine IF frequency is generated by the NCO.
Figure 2:
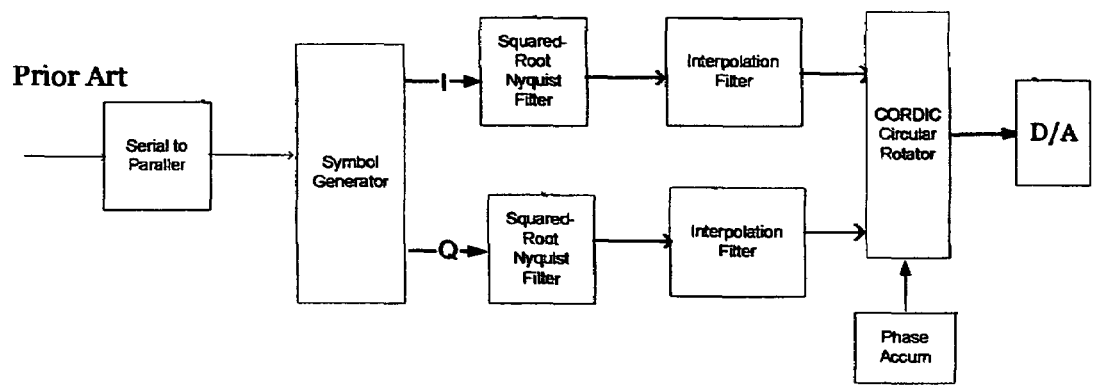
FIG. 2 depicts a Coordinate Rotation Digital Computer (CORDIC)-based digital QAM modulator.
Figure 3:
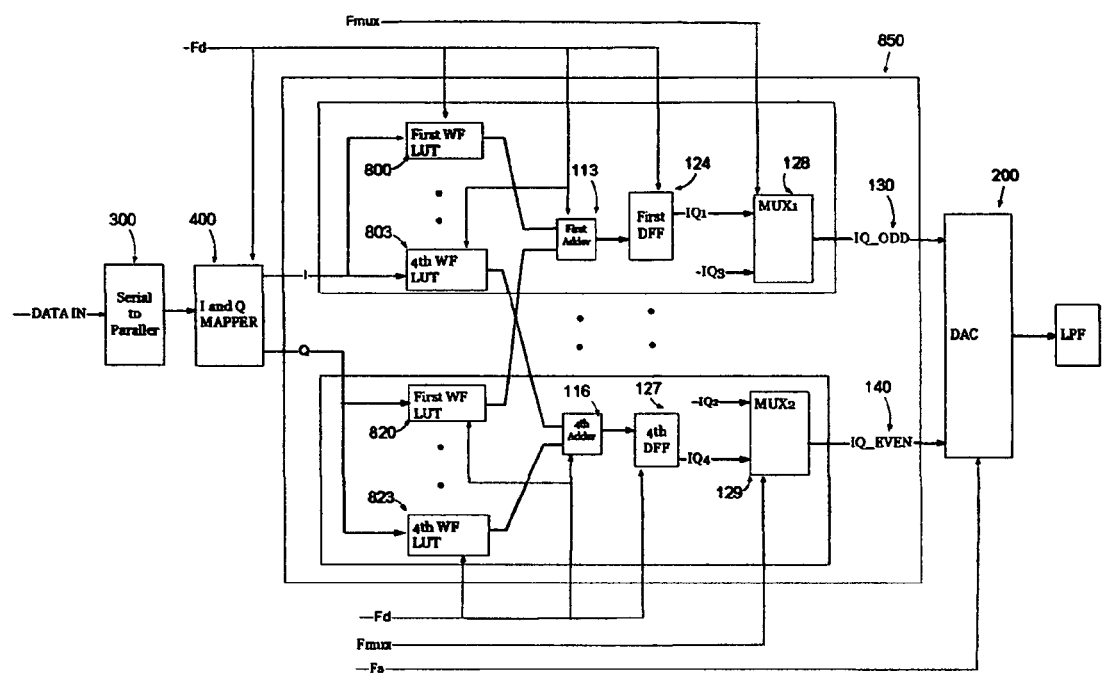
FIG. 3 shows an embodiment of the present digital IF modulator that applies to various modulation types and offers a simple and low cost method to implement a high speed digital IF modulator using FPGA.

As discussed above, commercially available digital IF QAM modulators use sine/cosine ROMs or CORDIC and/or a number of multipliers to generate the IF modulated waveforms. FIG. 3 shows an embodiment of the present digital IF modulator 850 that applies to various modulation types and offers a simple and low cost method to implement a high speed digital IF modulator using FPGA. The present architecture eliminates multipliers and sequential processing by storing the pre-computed and modulated cosine and sine carriers in ROM LUTs 800 to 803 and 820 to 823 respectively. These carriers are parallel processed in corresponding LUTs using adders 113 to 116 and registers 124 to 127. The main processing speed of the present digital IF modulator 850 is reduced from fs to fd (fs is at least 3 times the fd for over-sampling). Fd is symbol clock rate, which is the reduced data rate after the serial to parallel block. The value of fd is based on the equation fd=fbr/k, where fbr is the input data bit stream, k=log2M and M the number of QAM constellations. LUTs, adders and registers are components of an FPGA device; they are built into the FPGA for high-speed operations involving add/sub and memory accesses cycles.

Serial-to-Parallel module 300 and I and Q Mapper 400 implement typical functions that are required by any digital modulator. The 300 module converts input data from bit rate to symbol rate that is determined by the type of digital M-QAM modulator selected. For M=64, and fbr=96 Mbps, the fd is 16 MHz from equation fd=fbr/k, where k=log2M, fbr is the bit rate of the serial stream.

The output data of module 300 block is combined into a group of k-bits operating at a speed rate of fd fed into module 400 where I and Q are generated from a pre-selected constellation. The constellation is determined by the transmitted bit rate, available radio spectrum and the desired signal to noise ratio. The constellation selection is a compromise between radio bandwidth and acceptable bit error rate. The higher the constellation or larger the M-QAM selected, the smaller the radio bandwidth but higher the bit error rate. Once the selected constellation is determined, the I-bits and Q-bits are generated from the incoming k-bits group such that the combination of all I and Q bits will generate M-QAM constellation points. Since, it is known a priori what each constellation point waveform should be, the calculated results can be stored in LUTs and the I-bits and Q-bits can be used to generate the right point Taking advantage of the inherent LUTs and Adders and Registers in a FPGA device, the desired waveform of each constellation point can be parallel accessed to reduced the FPGA processing speed. The Nyquist rule dictates that the digital frequency should be at least 2 times the analog frequency. For practical applications, this number is usually 4. LUTs 800 to 803 store all possible waveforms of cosine and LUTs 820 to 823 store all possible waveform of sine. There are 4 LUTs tables for cosine and 4 LUTs for sine due to the reason explained above. Thus the output of the LUTs will generated a digitally modulated sine and cosine waveform and adders following the LUTs combine the sine and cosine into a digitally modulated QAM signal. The adders are shown in 113, 114, 115 and 116. The registers 124 to 127 that follow the adders are provided to digitally repeat the constellation point The multiplexers 128 to 129 are also used to output the parallel digital samples into the DAC (Digital to Analog Converter) in serial format at a final clock rate of fs=fcL, where fc is the output carrier frequency and L is the upsampling selection. Without using the present scheme, the FPGA device processing speed would have to be fs instead of fd. For high output frequency and high upsampling, the ratio fs/fd could be 10 or higher. The reduction in logic speed improves performance of the FIPGA device and reduces cost.

FIG. 4A depicts the two vectors Aq and Ai with the angular rotation of ωct and phase as shown.

$$In = Ain \, Cos(\omega ct + \phi i) \qquad \text{Equation 1}$$

$$Qn = Aqn \, Sin(\omega ct + \phi q) \qquad \text{Equation 2}$$

$$S(t) = Ain \, Cos(\omega ct) + Aqn \, Sin(\omega ct) \qquad \text{Equation 3}$$

$$Ain = Aiqn \, Cos(\phi) \qquad \text{Equation 4}$$

$$Aqn = Aiqn \, Sin(\phi) \qquad \text{Equation 5}$$

Where, n=1 to M, M being the number of constellation points.

Ain and Aqn are know constellation points a priori, see FIG. 4B, which depicts the 4-QAM square constellation as an example. Thus the terms Ain Cos (ωct) and Aqn Sin(ωct) of S(t)=Ain Cos(wct)+Aqn Sin(wct).

Equation 3 can be pre-computed and stored in the ROM LUTs.

Equation 5 is a generic M-QAM IF modulator with the carrier frequency fc, and the amplitudes of Ain and Aqn. This invention eliminates all the multipliers in equations 3 through 5.

The following derivation shows how the elimination of the multipliers and the parallel processing of Equation 3 is possible. Digitally, Cos(ωct) and Sin (ωct) can be represented as $$Cos(t) = \sum_{K=-\infty}^{+\infty} C(kT)\delta(t - KT), \qquad \text{Equation 6}$$

$$Sine(t) = \sum_{K=-\infty}^{+\infty} Si(kT)\delta(t - KT), \qquad \text{Equation 7}$$

where T is the period of the delta function, Cos(t) is the discrete representation of Cosine in time domain, C(KT) is the amplitude of the Cosine at K sample of period T, Sine(t) is the discrete representation of Sine in time domain and Si(kT) is the amplitude of k sampled at T period.

FIG. 4B represents the 4-QAM constellation. Clearly, the Ain and Aiq are the magnitudes of the constellation's points. These magnitudes are scaled appropriately depending on the information pair (I,Q) and another word. If I and Q represent indexes of the two dimension array, then the exact constellation's position can be retrieved without performing multiplications as shown in equation 5 and 6.

Equation 4 shown in digital representation is:

$$S(t) = Ain(\Sigma C(kT)\delta(t-KT)) + Aqn \, \Sigma Si(kT)\delta(t-KT),$$

Or $$S(t) = \left[\left(Ain \sum_{K=1}^{L} C(kT)\right) + \left(Aqn \sum_{K=1}^{L} Si(kT)\right)\right] \sum_{-\infty}^{+\infty} \delta(t - KT) \text{ Or} \qquad \text{Equation 8}$$

-continued $$Ain \sum_{K=1}^{L} \cos(kT) = Ain[(\cos(T) + \cos(2T) +$$
$$\cos(3T) + \ldots \cos(LT)]$$
$$= Ain\cos(T) + Ain\cos(2T) +$$
$$Ain\cos(3T) + \ldots Ain\cos(LT)$$

$$Aqn \sum_{K=1}^{L} Si(kT) = AqnSi(T) + AqnSi(2T) +$$
$$AqnSi(3T) + \ldots AqnSi(LT)$$

$$S(1) = AinC(T) + AqnSi(T) \qquad \text{Equation 9}$$

$$S(2) = AinC(2t) + AqnSi(2T) \qquad \text{Equation 10}$$

$$S(3) = AinC(3T) + AqnSi(3T) \qquad \text{Equation 11}$$

$$S(4) = AinC(4t) + AqnSi(4T) \qquad \text{Equation 12}$$

$$S(L) = AinC(Lt) + AqnSi(LT) \qquad \text{Equation 13}$$

Where, S(1) ... S(L) are discrete sums of IF modulated cosine and sine.

Ain and Aqn are known magnitudes from the QAM modulation constellation selected a priori. C(T) ... C(LT), Si(T) ... Si(LT) are amplitudes of the cosine and sine waves scaled by the appropriate symbol data Ain and Aqn. The single cycles of pre-computed values of Ain, Aqn, and the cosine and sine samples can be stored in the ROMs, thus eliminating the need for multiplications. Only adder circuits are required for generating the digital IF modulated carrier. The numbers of adders corresponds to the up-sampling L. The other important aspect of this invention is the parallel processing of the S(1) to S(L). Since the Ain and Aiq are changing at the symbol rate, which is much slower than the sampling rate, $\delta(t-KT)$, low power and cost can be achieved with FPGA or ASIC devices. If the S(t) were implemented sequentially as in the prior art, multiplication and addition circuitry would have to operate at the sampling rate, $\delta(t-KT)$.

Figure 5:
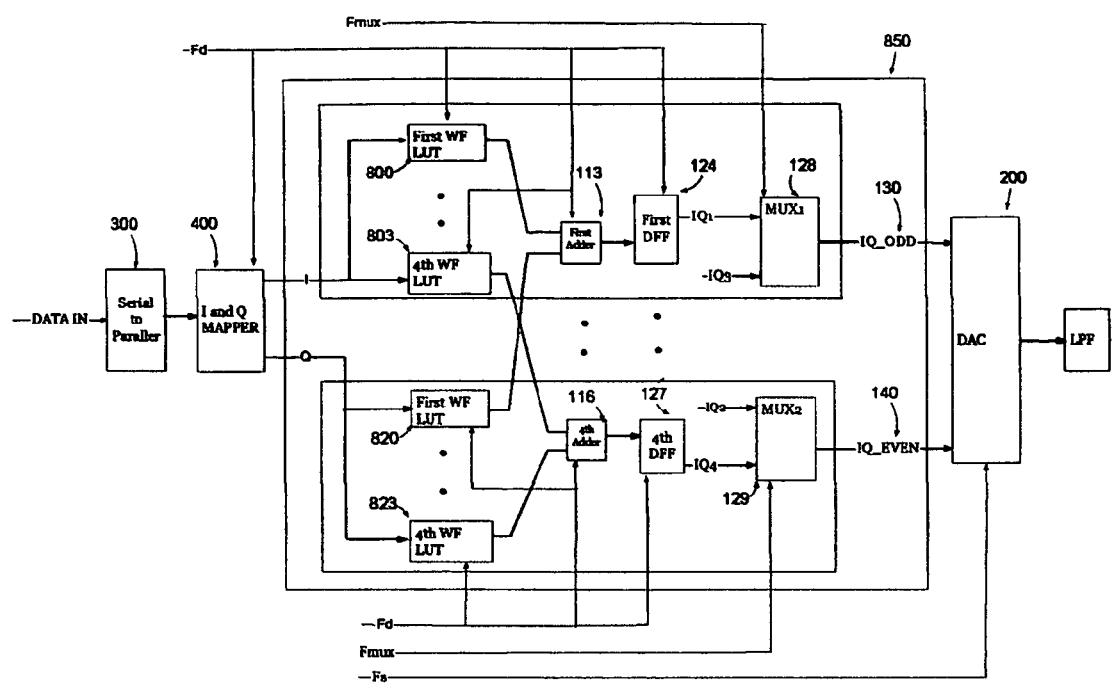
FIG. 5 depicts a digital 64-QAM IF modulator realized using Xilinx's Virtex-II and Analog Device 10-bit D/A converter.
Figures 6A, 6B, 6C, 6D, 6E:
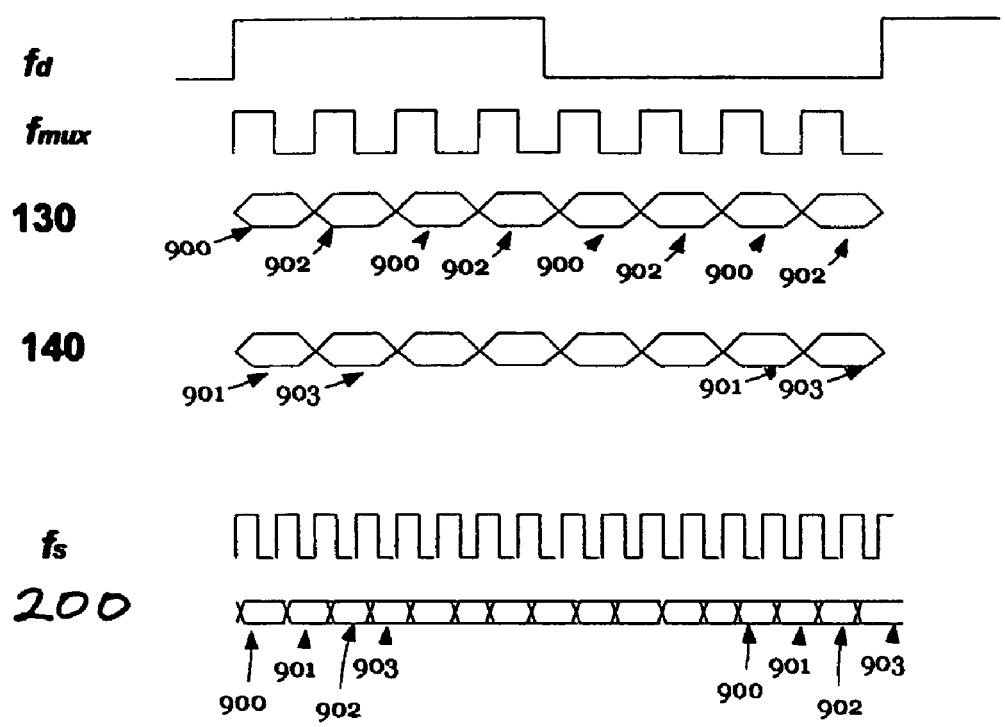
FIGS. 6A-6E depict the propagation of the digital samples 900 to 903 from 130 to 140 and finally to 200.

The invention is demonstrated via an implementation of digital IF modulator for 64-QAM. FIG. 5 depicts a digital 64-QAM IF modulator realized using Xilinx's Virtex-II and Analog Device 10-bit D/A converter. The 64-QAM IF modulator generates a carrier frequency of 80 MHz with the bit rate 96 Mbps. FIG. 5 shows the FGPA implementation of 300, 400 and 850. Analog device 10-bit D/A is interfaced to the FPGA via ribbon cable connection.

Serial-to-Parallel module 300 and I and Q Mapper 400 implement typical functions that are required by any digital modulator. The 300 module converts input data from bit rate to symbol rate that is determined by the type of digital M-QAM modulator selected. For M=64, and fbr=96 Mbps, the fd is 16 MHz from:

$$fd = fbr/k \qquad \text{Equation 14;}$$

$$fs = fcL \qquad \text{Equation 15; and}$$

$$fmux = fs/2 \qquad \text{Equation 16.}$$

Figures 7A, 7B, 7C:
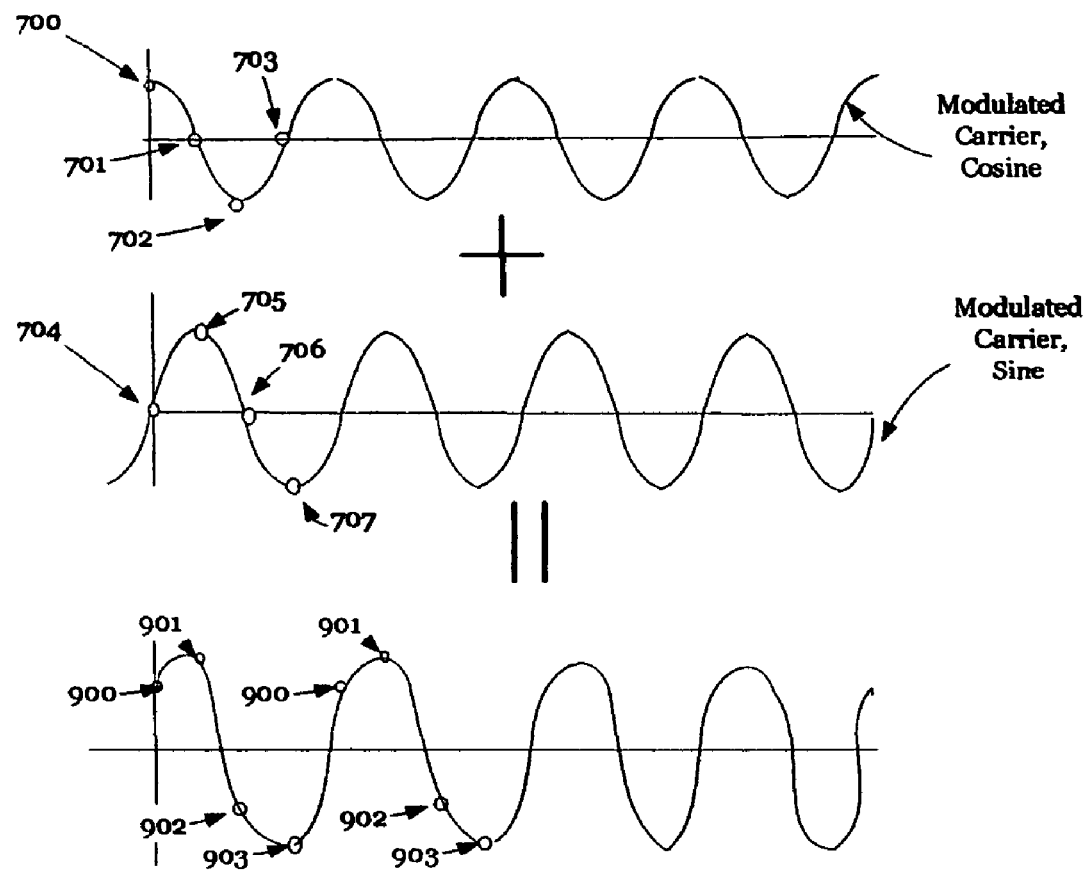
FIGS. 7A-7C shows a converted digital to analog signal and a smoothed output.

The output of module 300 block is fed into module 400 where I and Q are generated as selected constellations. The output of 400 are 3 bit I and 3-bit Q data toggled at the 16 MHz clock rate. Each of the 3-bit I and Q data are fed directly to the 800 to 803 and 820 to 823 as shown. The content 800 stores the first sample of all modulated cosine waveform scaled appropriately by Ain and Aqn data. Similarly, 801 to 803 are for samples 2 to 4. I/Q simultaneously address the contents of 800 to 803 and 820 to 824. The result of the 800 to 803 is added to the 820 to 823 respectively using adders 113 to 116. The adders' outputs are latched by registers 124 to 127 to maintain the modulated carrier waveforms for fd's duration. The sampled outputs are multiplexed via MUX modules 128 and 129, which reduce the speed of the sample output to fs/2. Module 128 transfers the $1^{st}$ and $3^{rd}$ samples and module 129 transfers the $2^{nd}$ and $4^{th}$ samples of each IF modulated waveforms. FIGS. 6A-6E depict the propagation of the digital samples 900 to 903 from 130 to 140 and finally to 200. As seen from FIGS. 6A-6E, the digital samples 900 to 903 are sums of the samples pairs (700, 704), (701, 705), (702, 706) and (703, 707) from FIG. 5. Each of those samples are parallel processed and interleaved in modules 128 and 129 and sequentially processed in the D/A at 320 MHz. An off-the-shell D/A device and LPF are used to convert the digital to analog signal and to smooth the output (FIGS. 7A-7C).

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A digital intermediate frequency Quadrature Amplitude Modulation modulator using parallel processing without the use of a multiplier, comprising:
    a serial-to-parallel data converter operatively connected to receive serial data, wherein said serial-to-parallel data converter converts a string of serial data to a plurality of parallel data;
    an I and Q mapper operatively connected to receive said plurality of parallel data and determine its I and Q locations;
    a plurality of look-up-tables (LUTs) operatively connected to receive and store said I and Q locations, wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;
    a plurality of adders operatively connected to receive and add said I and Q locations stored within said plurality of LUTs, wherein said plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;
    a plurality of registers operatively connected to collect and store said output data comprising $IQ_1$ to $IQ_{IQN}$; and
    a digital to analog converter operatively connected to convert said output data comprising $IQ_1$ to $IQ_{IQN}$ to analog data, wherein said Quadrature Amplitude Modulation modulator does not include a multiplier.

2. A digital intermediate frequency Quadrature Amplitude Modulation modulator using parallel processing without the use of a multiplier, comprising:

a serial-to-parallel data converter operatively connected to receive serial data, wherein said serial-to-parallel data converter converts a string of serial data to a plurality of parallel data;

an I and Q mapper operatively connected to receive said plurality of parallel data and determine its I and Q locations;

a plurality of look-up-tables (LUTs) operatively connected to receive and store said I and Q locations, wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;

a plurality of adders operatively connected to receive and add said I and Q locations stored within said plurality of LUTs, wherein said plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;

a plurality of registers operatively connected to collect and store said output data comprising $IQ_1$ to $IQ_{IQN}$;

at least one multiplexer operatively connected to collect from said plurality of registers the subscript output data comprising only odd subscript output data from said output data comprising $IQ_1$ to $IQ_{IQN}$;

at least one multiplexer operatively connected to collect from said plurality of registers the subscript output data comprising only even subscript output data from said output data comprising $IQ_1$ to $IQ_{IQN}$; and a digital to analog converter operatively connected to convert said odd subscript data and said even subscript data to analog data, wherein said Quadrature Amplitude Modulation modulator does not include a multiplier.

3. The digital intermediate frequency Quadrature Amplitude Modulation modulator using parallel processing without the use of a multiplier of claim 2, wherein said at least one multiplexer operatively connected to collect from said plurality of registers the subscript output data comprising only odd subscript output data from said output data comprising $IQ_1$ to $IQ_{IQN}$ comprises n×2 multiplexers, where n is an integer, and wherein said at least one multiplexer is operatively connected to collect from said plurality of registers the subscript output data comprising only even subscript output data from said output data comprising $IQ_1$ to $IQ_{IQN}$ comprises n×2 multiplexers.

4. A digital intermediate frequency Quadrature Amplitude Modulation modulator using parallel processing without the use of a multiplier, comprising:

a plurality of look-up-tables (LUTs) operatively connected to receive and store I and Q locations, wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;

a plurality of adders operatively connected to receive and add said I and Q locations stored within said plurality of LUTs, wherein said plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;

a plurality of registers operatively connected to coiled and store said output data comprising $IQ_1$ to $IQ_{IQN}$;

a first multiplexer operatively connected to collect from said plurality of registers only odd subscript output data from said output data comprising $IQ_1$ to $IQ_{IQN}$;

a second multiplexer operatively connected to collect from said plurality of registers only even subscript output data from said output data comprising $IQ_1$ to $IQ_{IQN}$; and a digital to analog converter operatively connected to convert said odd subscript data and said even subscript data to analog data, wherein said Quadrature Amplitude Modulation modulator does not include a multiplier.

5. The digital intermediate frequency Quadrature Amplitude Modulation modulator using parallel processing without the use of a multiplier of claim 4, wherein said first multiplexer comprises n×2 multiplexers, where n is an integer, and wherein said second multiplexer comprises n×2 multiplexers.

6. A digital intermediate frequency Quadrature Amplitude Modulation modulator using parallel processing without the use of a multiplier comprising:

a plurality of look-up-tables (LUTs) operatively connected to receive and store I and Q locations, wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;

a plurality of adders operatively connected to receive and add said I and Q locations stored within said plurality of LUTs, wherein said plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;

a plurality of registers operatively connected to collect and store said output data comprising $IQ_1$ to $IQ_{IQN}$; and a digital to analog converter operatively connected to convert said output data comprising $IQ_1$ to $IQ_{IQN}$ to analog data, wherein said Quadrature Amplitude Modulation modulator does not include a multiplier.

7. A method for processing data with a digital intermediate frequency QAM modulator using parallel processing without the use of a multiplier, comprising:

receiving and converting a string of serial data into a plurality of parallel data;

determining the I and Q locations of said plurality of parallel data;

storing said I and Q locations in a plurality of look-up-tables (LUTs), wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;

receiving and adding said I and Q locations stored within said plurality of LUTs, wherein a plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;

collecting and storing said output data comprising $IQ_1$ to $IQ_{IQN}$ in a plurality of registers; and converting said output data comprising $IQ_1$ to $IQ_{IQN}$ to analog data in a digital to analog converter, wherein said Quadrature Amplitude Modulation modulator does not include a multiplier.

8. A method for processing data in a digital intermediate frequency QAM modulator using parallel processing without the use of a multiplier, comprising:

receiving and converting a string of serial data to a plurality of parallel data;

receiving said plurality of parallel data in an I and Q mapper and determine the I and Q locations of said plurality of parallel data;

receiving and storing said I and Q locations in a plurality of look-up-tables (LUTs), wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;

receiving and adding said I and Q locations stored within said plurality of LUTs in a plurality of adders, wherein said plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;

collecting and storing in a plurality of registers said output data comprising $IQ_1$ to $IQ_{IQN}$;

collecting, in a first multiplexer, from said plurality of registers, the subscript output data comprising only odd subscript output data from said output data comprising $IQ_1$ to $IQ_{IQN}$;

collecting, in a second multiplexer, from said plurality of registers, the subscript output data comprising only even subscript output data from said output data comprising $IQ_1$ to $IQ_{IQN}$; and converting, a digital to analog converter, said odd subscript data and said even subscript data to analog data, wherein said Quadrature Amplitude Modulation modulator does not include a multiplier.

9. The method of claim 8, wherein said first multiplexer comprises n×2 multiplexers, where n is an integer, and wherein said second multiplexer comprises n×2 multiplexers.

10. A method for processing data in a digital intermediate frequency QAM modulator using parallel processing without the use of a multiplier, comprising: receiving and storing in a plurality of look-up-tables (LUTs), I and Q locations, wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;

receiving and adding in a plurality of adders said I and Q locations stored within said plurality of LUTs, wherein said plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;

collecting and storing in a plurality of registers said output data comprising $IQ_1$ to $IQ_{IQN}$;

collecting in a first multiplexer only odd subscript output data from said output data comprising $IQ_1$ to $IQ_{IQN}$;

collecting in a second multiplexer only even subscript output data from said output data comprising $IQ_1$ to $IQ_{IQN}$; and converting in a digital to analog converter said odd subscript data and said even subscript data to analog data, wherein said Quadrature Amplitude Modulation modulator does not include a multiplier.

11. The method of claim 10, wherein said first multiplexer comprises n×2 multiplexers, where n is an integer, and wherein said second multiplexer comprises n×2 multiplexers.

12. A method for processing data with a digital intermediate frequency Quadrature Amplitude Modulation modulator using parallel processing without the use of a multiplier, comprising:

receiving and storing, in a plurality of look-up-tables (LUTs) I and Q locations, wherein the I LUTs are configured $I_1$ to $I_N$, wherein N is the highest number of I LUTs of said plurality of LUTs, wherein the Q LUTs are configured $Q_1$ to $Q_X$, wherein X is the highest number of Q LUTs of said plurality of LUTs;

receiving and adding in a plurality of adders said I and Q locations stored within said plurality of LUTs, wherein said plurality of adders are configured $A_1$ to $A_{IQN}$, wherein IQN is the highest number of adders of said plurality of adders, wherein each I and Q having a particular subscript are added in the adder having the same subscript to produce output data comprising $IQ_1$ to $IQ_{IQN}$;

collecting and storing in a plurality of registers said output data comprising $IQ_1$ to $IQ_{IQN}$; and converting in a digital to analog converter said output data comprising $IQ_1$ to $IQ_{IQN}$ to analog data, wherein said Quadrature Amplitude Modulation modulator does not include a multiplier.

* * * * *